United States Patent
Cho et al.

(10) Patent No.: US 7,432,759 B2
(45) Date of Patent: Oct. 7, 2008

(54) ELIMINATION OF POP-UP NOISE IN CLASS D AMPLIFIER

(75) Inventors: Yong-Jin Cho, Incheon (KR); Seung-Bin You, Seongnam-Si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 56 days.

(21) Appl. No.: 11/496,693

(22) Filed: Jul. 31, 2006

(65) Prior Publication Data

US 2007/0030061 A1    Feb. 8, 2007

(30) Foreign Application Priority Data

Aug. 5, 2005    (KR) .................. 10-2005-0071658

(51) Int. Cl.
*H03F 3/38*    (2006.01)
(52) U.S. Cl. ..................................... 330/10; 330/207 A
(58) Field of Classification Search .............. 330/10, 330/251, 207 A
See application file for complete search history.

(56) References Cited

U.S. PATENT DOCUMENTS 6,781,458 B2* 8/2004 Mazda ..................... 330/251

7,078,963 B1* 7/2006 Andersen et al. ............ 330/10

OTHER PUBLICATIONS

Korean Patent Application No. 1020030013726 to Yasuomi, having Publication date of Sep. 19, 2003 (w/ English Abstract page).
Japanese Patent Application No. 2000-029375 to Shigeaki, having Publication date of Aug. 17, 2001 (w/ English Abstract page).
Japanese Patent Application No. 2001-312301 to Shigeru, having Publication date of Apr. 25, 2003 (w/ English Abstract page).
Japanese Patent Application No. 2002-001276 to Kunihiko, having Publication date of Jul. 18, 2003 (w/ English Abstract page).
Korean Patent Application No. 1020020054939 to Jang et al., having Publication date of Mar. 18, 2004 (w/ English Abstract page).
Soo-hyoung Lee et al., "A 2W, 92% Efficiency and 0.01% THD+N Class-D Audio Power Amplifier for Mobile Applications, based on the Novel SCOM Architecture", IEEE 2004 Custom Integrated Circuits Conference, pp. 291-294.

* cited by examiner

*Primary Examiner*—Robert Pascal
*Assistant Examiner*—Hieu P Nguyen
(74) *Attorney, Agent, or Firm*—Monica H. Choi

(57) ABSTRACT

A class D amplifier includes a driver circuit and a reset circuit. The driver circuit is configured to amplify a PWM (pulse width modulation) signal to generate an amplified PWM signal. The reset circuit applies a predetermined voltage at an input of the driver circuit for a time period after a power supply voltage is applied or before the power supply voltage is deactivated, for eliminating pop-up noise.

20 Claims, 8 Drawing Sheets

FIG. 5
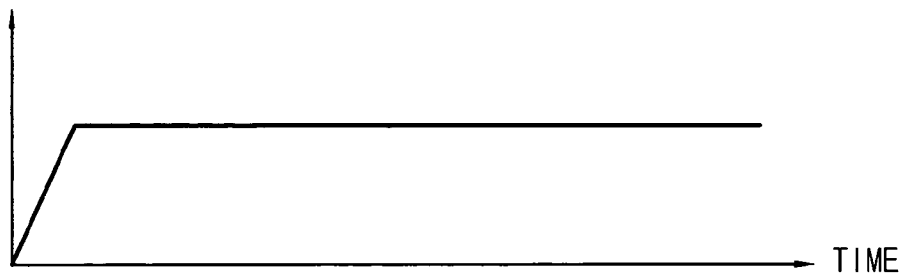
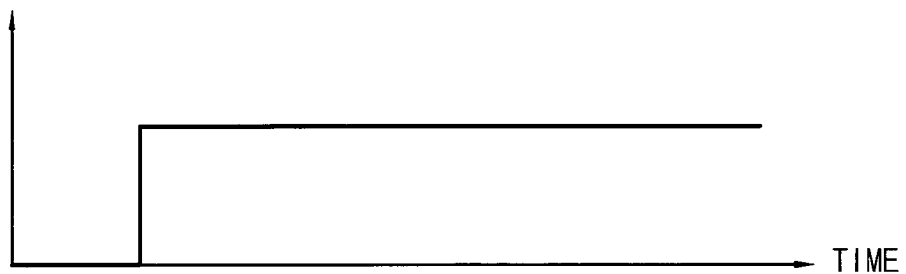
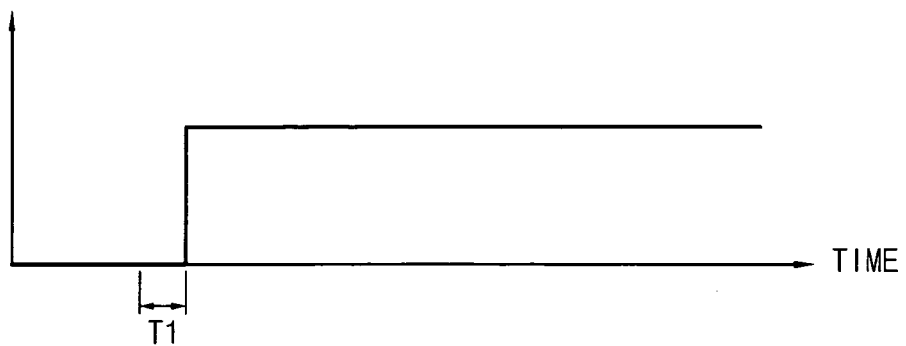

FIG. 6
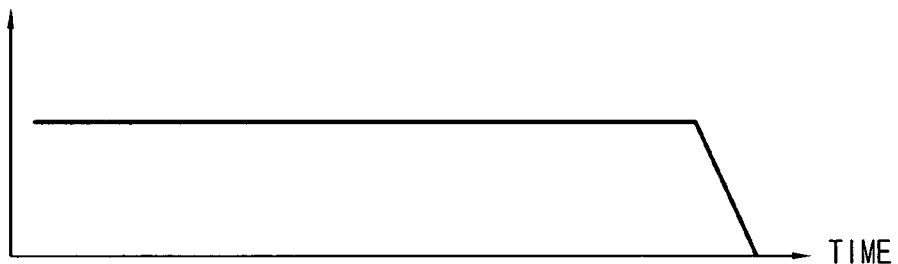
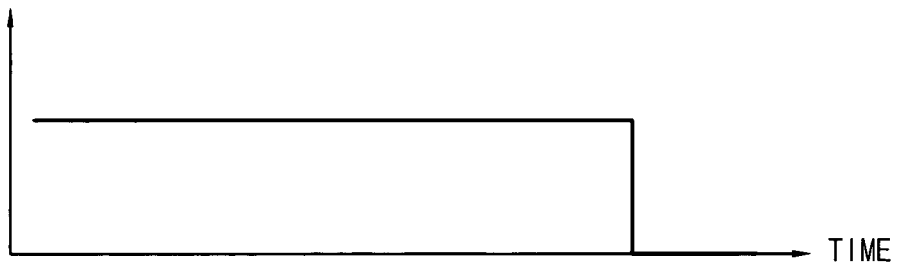
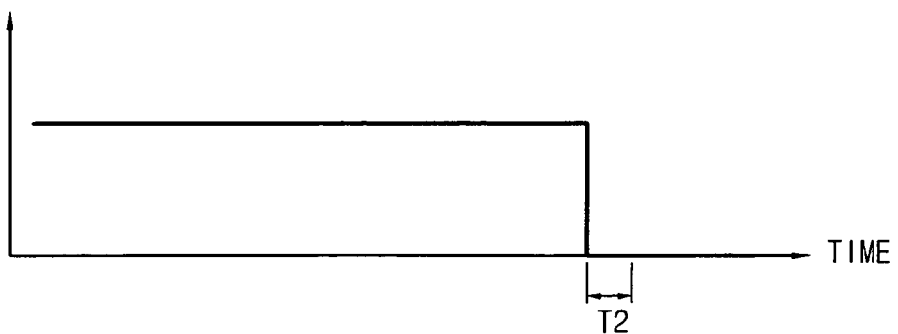

FIG. 7
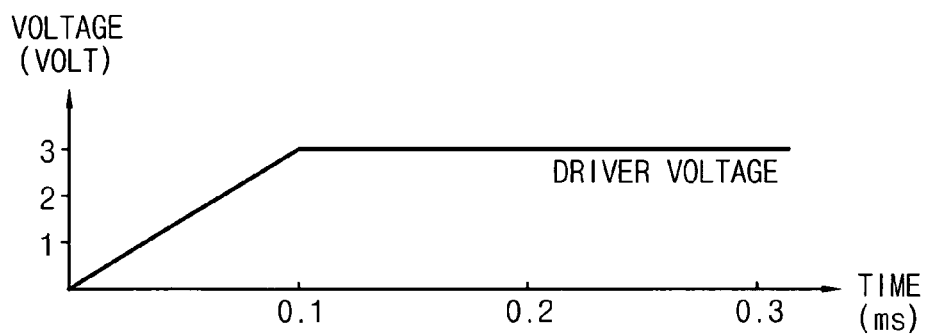
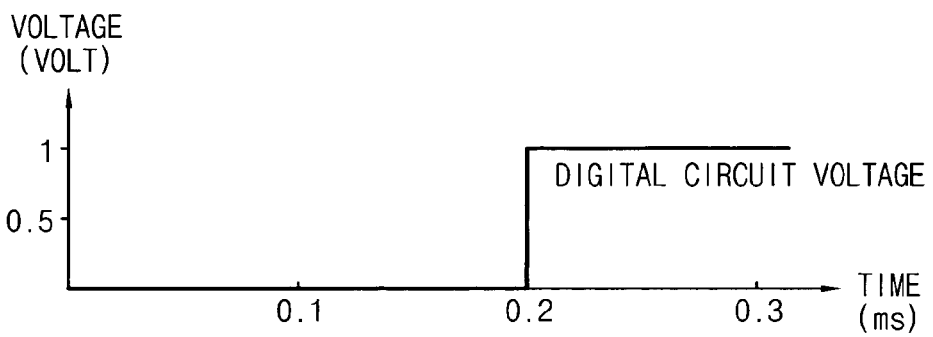
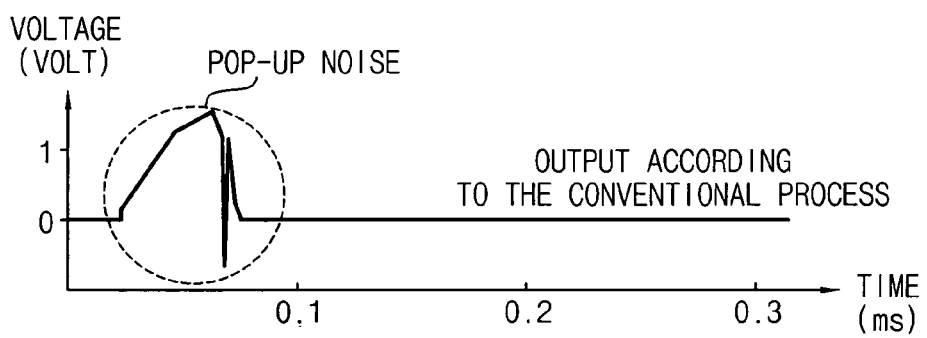
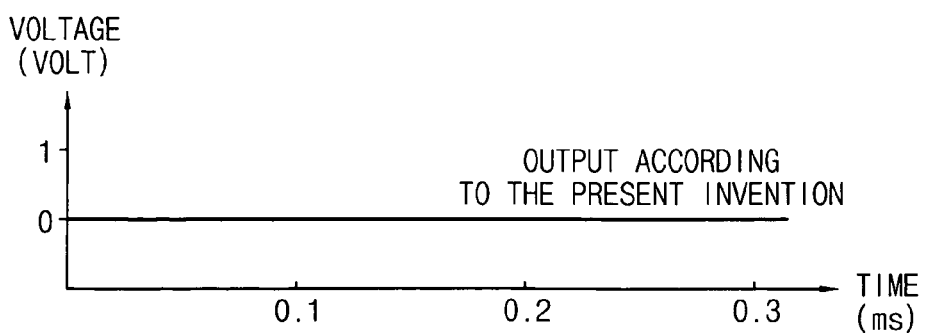

ELIMINATION OF POP-UP NOISE IN CLASS D AMPLIFIER

This application claims priority to Korean Patent Application No. 2005-71658, filed on Aug. 5, 2005 in the Korean Intellectual Property Office, the disclosure of which is incorporated herein in its entirety by reference.

BACKGROUND OF THE INVENTION

1. Field of the Invention

The present invention relates generally to audio amplifiers, and more particularly, to eliminating pop-up noise in a class D audio amplifier from application of a power voltage.

2. Description of the Related Art

A class D amplifier modulates an audio signal to generate a pulse signal using pulse width modulation (PWM). The pulse signal is further processed by a low-pass filter, and a speaker generates sounds from the filtered pulse signal. The class D amplifier has higher efficiency than a class A amplifier, a class B amplifier, or a class AB amplifier, because the class D amplifier operates transistors only in a switching mode.

Thus, the class D amplifier has a high efficiency that is typically more than 80% at maximum output. In addition, the class D amplifier implemented with a silicon chip has a small size with low cost. Accordingly, the class D amplifier is widely used in low power applications such as mobile terminals, etc.

FIG. 1 is a block diagram of a conventional class D amplifier as disclosed in Korean Patent Laid-Open Publication No. 2003-74234. A signal source SIG generates an analog audio signal VIN that is centered on a ground voltage. The signal source SIG is connected to an input terminal TI of the class D amplifier 900 through an input condenser (not shown) for removing direct current (DC) components of the audio signal.

The class D amplifier 900 is a kind of a PWM (pulse width modulation) amplifier, and includes an input stage 901, a modulation circuit 902, a driving circuit 903, and n-type power metal-oxide semiconductor (MOS) transistors 904 and 905. The input stage 901 adjusts a reference point of the audio signal VIN to be suitable for input characteristics of the modulation circuit 902 operating at a power supply voltage VDD (for example, 10 V).

The modulation circuit 902 modulates an audio signal outputted from the input stage 901 into a pulse signal. The modulation circuit 902 converts a feature of the audio signal into a pulse width of a carrier signal to generate a pulse signal according to PWM (pulse width modulation). The driving circuit 903 complementarily controls the power MOS transistors 904 and 905 based on the pulse signal from the modulation circuit 902.

The power MOS transistor 904 is coupled between a positive power supply voltage VPP+ (for example, +50 V) and an output terminal TO. The power MOS transistor 905 is coupled between a negative power supply voltage VPP− (for example, −50 V) and the output terminal TO. The power MOS transistor 904 operates as a switch for charging the output terminal TO to a logic high state (i.e., VPP+) when turned on, and the power MOS transistor 905 operates as a switch for discharging the output terminal TO to a logic low state (i.e., VPP−) when turned on.

The output terminal TO is connected to an input terminal of a speaker SPK via a low-pass filter having an inductor L and a condenser C. A carrier frequency component of the power-amplified pulse signal at the output terminal TO is removed by such a low-pass filter. The filtered power-amplified pulse signal is an analog audio signal that is used by the speaker SPK to generate sound.

However, the conventional class D amplifier 900 of FIG. 1 removes pop-up noise generated during a volume control, etc., only during a normal operation state after a power supply voltage is applied. Another conventional class D amplifier 900 may remove pop-up noise generated during application of the power supply voltage using additional elements such as a relay inserted between the speaker SPK and the low-pass filter. In that case, the relay remains opened until internal operations of the class D amplifier are stabilized. However, including such a relay increases the size and cost of an audio device having the class D amplifier.

Japanese Patent Laid-Open Publication No. 2003-124749 discloses providing the pulse width modulated signal to a driving stage through an AND gate that is controlled by a mute signal for removing pop-up noise. However, although the pop-up noise may be removed effectively after the power supply voltage applied on the AND gate has stabilized, the pop-up noise may not be removed effectively as the power supply voltage begins to be provided.

In addition, according to Japanese Patent Laid-Open Publication No. 2003-204590, a mute signal may be generated after the applied power supply voltage has been stabilized for a short time. However, the mute signal may not be generated when the power supply voltage is slowly provided for a relatively long time, such that the pop-up noise is still generated.

Therefore, a low-cost and small class D amplifier with eliminated pop-up noise is desired.

SUMMARY OF THE INVENTION

Accordingly, the present invention uses a small and low-cost reset circuit for applying a predetermined voltage at an input of a driver circuit for eliminating pop-up noise in a class D amplifier.

A class D amplifier according to an aspect of the present invention includes a driver circuit and a reset circuit. The driver circuit is configured to amplify a PWM (pulse width modulation) signal to generate an amplified PWM signal. The reset circuit applies a predetermined voltage at an input of the driver circuit for a time period after a power supply voltage for the class D amplifier is applied or before the power supply voltage is deactivated.

In one embodiment of the present invention, the driver circuit includes a power output stage having a P-channel power transistor and an N-channel power transistor that are complementarily turned on depending on a logic state of the PWM signal.

In a further embodiment of the present invention, the predetermined voltage from the reset circuit turns off the P-channel power transistor for the time period. Alternatively, the predetermined voltage from the reset circuit turns on the N-channel power transistor for the time period.

In one embodiment of the present invention, the driver circuit includes a P-channel buffer and an N-channel buffer. The P-channel buffer amplifies a P-channel PWM signal to generate an amplified P-channel PWM signal that is applied on a gate of the P-channel power transistor. The N-channel buffer amplifies an N-channel PWM signal to generate an amplified N-channel PWM signal that is applied on a gate of the N-channel power transistor.

In a further embodiment of the present invention, the reset circuit includes a switch coupled between an input of one of the P-channel and N-channel buffers and a voltage source generating the predetermined voltage. Such a switch is a field effect transistor in one embodiment of the present invention. In addition, the reset circuit includes a reset signal source that turns on the switch for the time period.

In another embodiment of the present invention, the class D amplifier further includes a delay controller for generating the P-channel and N-channel PWM signals each with a respective transition such that the P-channel and N-channel power transistors are not turned on simultaneously.

In an example embodiment of the present invention, the time period is after the power supply voltage to the driver circuit is applied or before the power supply voltage to the delay controller is deactivated. Additionally, the time period is determined from when the power supply voltage reaches a predetermined threshold voltage.

The class D amplifier of the present invention may be used to particular advantage in an audio device having a PWM (pulse width modulation) processor that converts audio data into the PWM signal. In addition, such an audio device also includes a low-pass filter and a speaker. The amplified PWM signal is low-pass filtered to provide an audio signal that the speaker uses for generating sound.

In this manner, the reset circuit of the present invention turns off the P-channel power transistor or turns on the N-channel power transistor for eliminating pop-up noise during application of the power supply voltage to components of the class D amplifier. The reset circuit may be implemented as a silicon chip such that the class D amplifier having eliminated pop-up noise is still small and formed with low cost.

BRIEF DESCRIPTION OF THE DRAWINGS

The above and other features and advantages of the present invention will become more apparent when described in detailed exemplary embodiments thereof with reference to the attached drawings in which:

FIG. 5 is a timing diagram of signals during operation of the class D amplifier of FIG. 3 or 4 at application of a power supply voltage, according to an embodiment of the present invention;

FIG. 6 is a timing diagram of signals during operation of the class D amplifier of FIG. 3 or 4 upon deactivation of the power supply voltage, according to an embodiment of the present invention;

FIG. 7 is a timing diagram of signals illustrating elimination of pop-up noise upon application of the power supply voltage, according to an embodiment of the present invention.

The figures referred to herein are drawn for clarity of illustration and are not necessarily drawn to scale. Elements having the same reference number in FIGS. 1, 2, 3, 4, 5, 6, 7, and 8 refer to elements having similar structure and/or function.

DETAILED DESCRIPTION OF THE INVENTION

Figure 1:
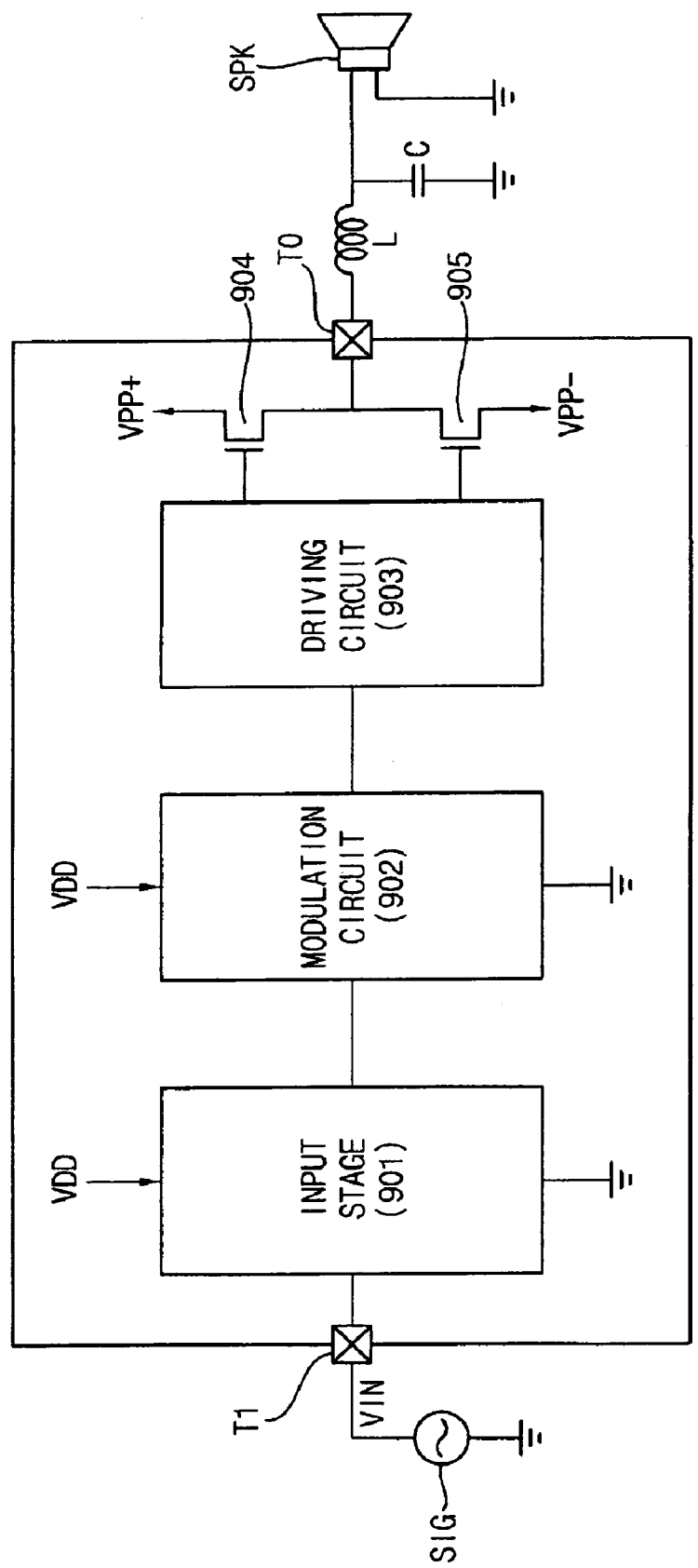
FIG. 1 is a block diagram of a conventional class D amplifier.
Figure 2:
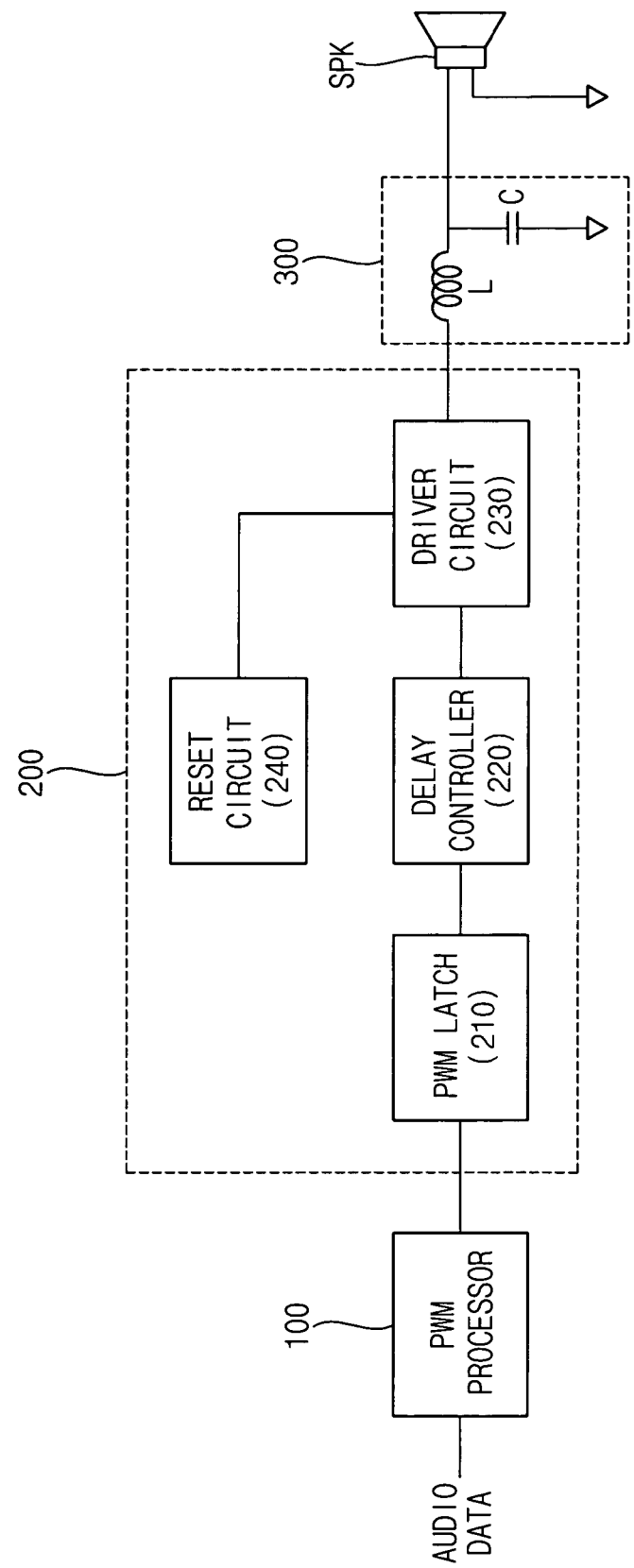
FIG. 2 is a block diagram of an audio device with eliminated pop-up noise according to an embodiment of the present invention.

FIG. 2 is a block diagram of an audio device with eliminated pop-up noise according to an embodiment of the present invention. Referring to FIG. 2, the audio device includes a PWM (pulse width modulation) processor 100, a class D amplifier 200, a low-pass filter 300, and a speaker SPK. The PWM processor 100 modulates received audio data according to a PWM (pulse width modulation) process The audio data may be analog audio data or digital audio data. The PWM processor 100 converts analog audio data into digital audio data with an analog audio converter (not shown), and then modulates the digital audio data according to the PWM process.

In an example embodiment, the PWM processor 100 generates a PWM signal using a third-order 32× sigma-delta modulator that performs over-sampling and noise shaping on the audio data. The noise shaping shifts noise within an audio frequency interval (for example, 20 Hz through 20 KHz) to a high-frequency range.

The class D amplifier 200 receives and amplifies the PWM signal to generate an amplified PWM signal. The class D amplifier 200 includes a PWM (pulse width modulation) latch 210, a delay controller 220, a driver circuit 230, and a reset circuit 240.

The PWM latch 210 synchronizes the PWM signal from the PWM processor 100 with a clock signal for the class D amplifier to generate a synchronized PWM signal to the delay controller 220. The delay controller 220 generates a P-channel PWM signal and an N-channel PWM signal with controlled transition timing from the synchronized PWM signal as will be described further herein. The PWM latch 210 may be incorporated within the delay controller 220.

The driver circuit 230 receives and amplifies the P-channel and N-channel PWM signals to output the amplified PWM signal as will be described in more detail herein in reference to FIGS. 3 and 4. The reset circuit 240 eliminates pop-up noise during initial application of a power supply voltage to the class D amplifier, as will be described in more detail herein in reference to FIGS. 3 and 4.

The low-pass filter 300 performs low-pass filtering on the amplified PWM signal from the class D amplifier 200 to generate an audio signal. The speaker SPK generates sound from such an audio signal.

Figure 3:
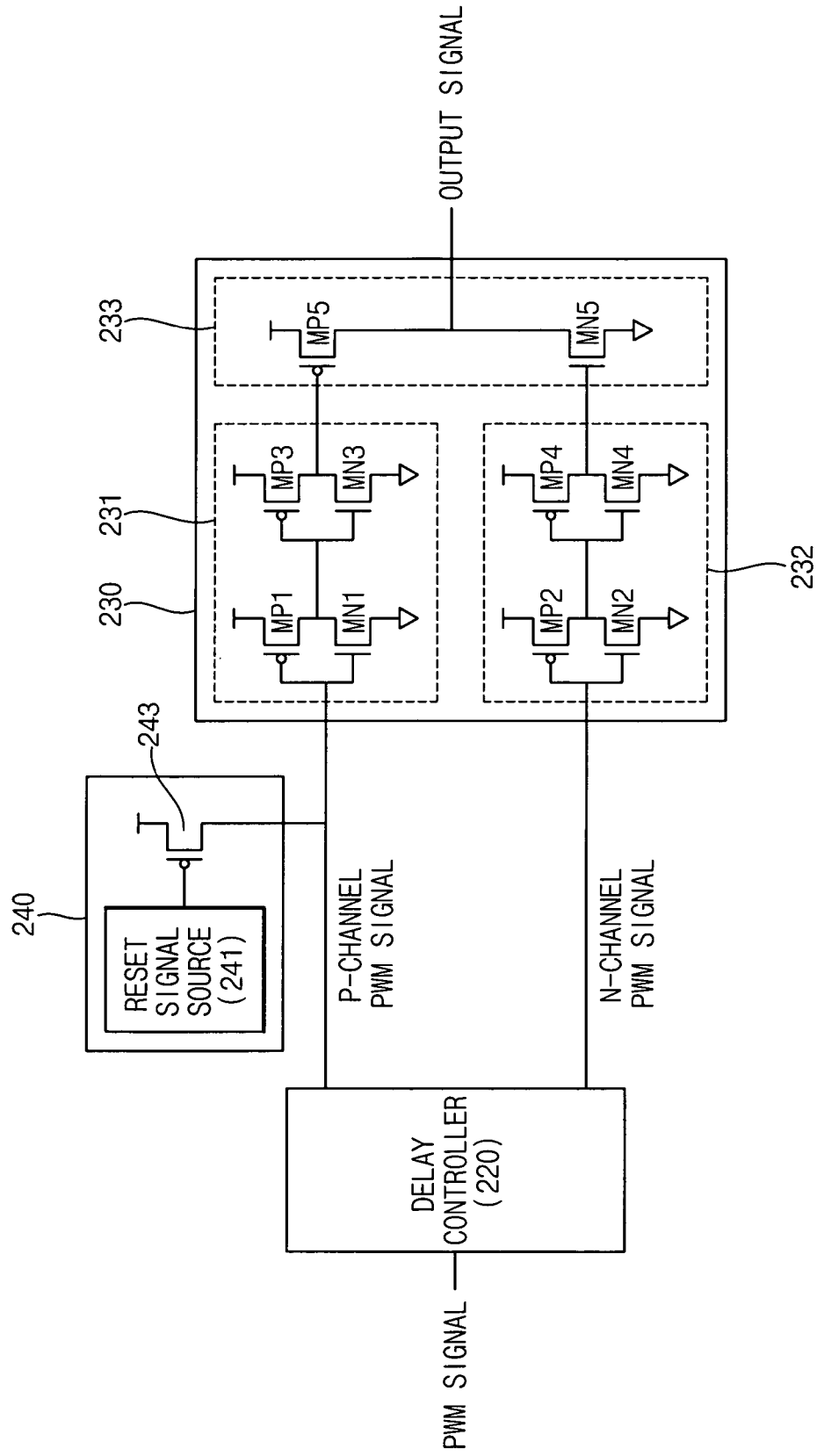
FIG. 3 is a circuit diagram of components within a class D amplifier in FIG. 2, according to an embodiment of the present invention.

FIG. 3 is a circuit diagram of the driver circuit 230 and the reset circuit 240 of FIG. 2, according to an embodiment of the present invention. The driver circuit 230 includes a P-channel buffer 231, an N-channel buffer 232, and a power output stage 233.

The P-channel buffer 231 amplifies the P-channel PWM signal from the delay controller 220. The P-channel buffer 231 is comprised of a first P-channel inverter formed with a P-channel field effect transistor MP1 and an N-channel field effect transistor MN1 coupled between the power voltage source and a ground node. Such a first P-channel inverter is coupled to a second P-channel inverter formed with another P-channel field effect transistor MP3 and another N-channel field effect transistor MN3 coupled between the power voltage source and the ground node.

The N-channel buffer 232 amplifies the N-channel PWM signal from the delay controller 220. The N-channel buffer 232 is comprised of a first N-channel inverter formed with a P-channel field effect transistor MP2 and an N-channel field effect transistor MN2 coupled between the power voltage source and the ground node. Such a first N-channel inverter is coupled to a second N-channel inverter formed with another P-channel field effect transistor MP4 and another N-channel field effect transistor MN4 coupled between the power voltage source and the ground node.

The power output stage 233 includes a power PMOS (P-channel metal oxide semiconductor) field effect transistor MP5 coupled between the power supply source and an output node having the amplified PWM signal generated thereon. The power output stage 233 also includes a power NMOS (N-channel metal oxide semiconductor) field effect transistor MN5 coupled between the output node and the ground node.

The P-channel buffer 231 amplifies the P-channel PWM signal to provide an amplified P-channel PWM signal to a gate of the PMOS transistor MP5. The N-channel buffer 232 amplifies the N-channel PWM signal to provide an amplified N-channel PWM signal to a gate of the NMOS transistor MN5.

When the PWM signal transitions from the logic low state to the logic high state, the PMOS transistor MP5 is turned off after being turned on, and the NMOS transistor MN5 is turned on after being turned off. If the NMOS transistor MN5 is turned on before the PMOS transistor MP5 is turned off, the transistors MN5 and MP6 are turned on simultaneously resulting in unnecessary power dissipation.

Similarly when the PWM signal transitions from the logic high state to the logic low state, the PMOS transistor MP5 is turned on after being turned off, and the NMOS transistor MN5 is turned off after being turned on. If the PMOS transistor MP5 is turned on before the NMOS transistor MN5 is turned off, the transistors MN5 and MP5 are turned on simultaneously resulting in unnecessary power dissipation.

The delay controller 220 controls the timing of such transitions in the P-channel and N-channel PWM signals to ensure that the transistors MN5 and MP5 are not turned on simultaneously. Thus, when the PWM signal transitions from the logic low state to the logic high state, the delay controller 220 generates the N-channel PWM signal to have such a rising transition after that for the P-channel PWM signal such that the NMOS transistor MN5 is turned on after the PMOS transistor MP5 is turned off from such a rising transition.

Similarly, when the PWM signal transitions from the logic high state to the logic low state, the delay controller 220 generates the N-channel PWM signal to have such a falling transition before that for the P-channel PWM signal such that the NMOS transistor MN5 is turned off before the PMOS transistor MP5 is turned on from such a falling transition.

Otherwise during time intervals without a transition, the P-channel and N-channel PWM signals have substantially the same logic states. The delay controller 220 controls the timing of a respective transition in each of the P-channel and N-channel PWM signals to prevent the transistors MN5 and MP5 from being turned on simultaneously.

The power output stage 233 further amplifies the P-channel PWM signal amplified by the P-channel buffer 231 and the N-channel PWM signal amplified by the N-channel buffer 232. The further amplified PWM signal is generated at an output terminal coupled to the low pass filter 300.

The reset circuit 240 prevents pop-up noise that may be generated when the power supply voltage begins to be provided to the class D amplifier 200. Generation of pop-up noise without the reset circuit 240 is now described.

As the power supply voltage begins to be applied to the class D amplifier 200, assume that the power supply voltage is not yet completely stabilized to the delay controller 220 but the power supply voltage is sufficiently stabilized for operation of the driver circuit 230. In that case, the delay controller 220 does not operate properly such that the inputs of the P-channel and N-channel buffers 231 and 232 are floating and may each unpredictably be at the logic high state or logic low state.

When the input of the P-channel buffer 231 is at such a logic low state, the PMOS transistor MP5 is turned on, and the output signal is at the logic high state which corresponds to pop-up noise. Alternatively, when the power supply voltage has stabilized sufficiently for proper operation of the delay controller 220 even in the case when the power supply voltage is insufficiently stabilized for operation of the driver circuit 230, the above pop-up noise does not occur.

Generally, the reset circuit 240 prevents the driver circuit 230 from amplifying the PWM signals before the delay controller 220 properly generates the PWM signals. As illustrated in FIG. 2, the reset circuit 240 prevents the driver circuit 230 from operating until a sufficiently stable power voltage is applied to the PWM processor 100, the PWM latch 210, and the delay controller 220.

Figure 8:
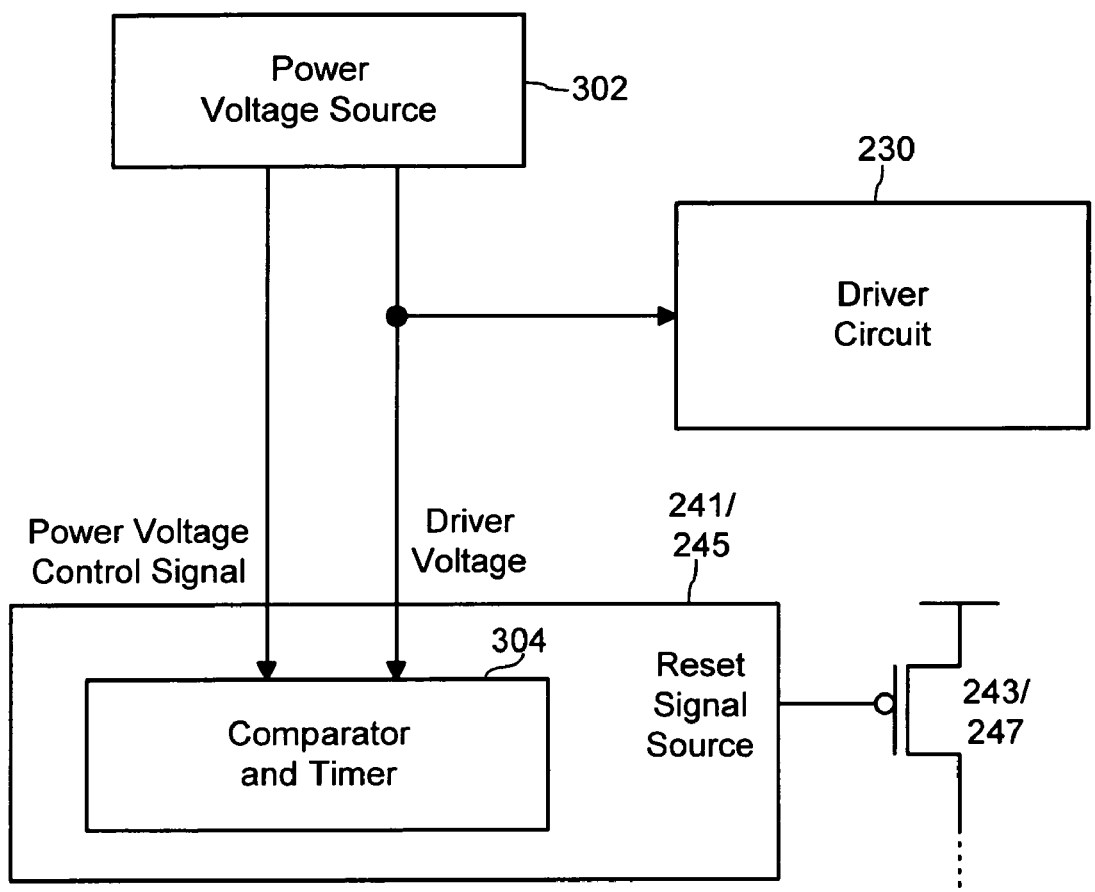
FIG. 8 shows a block diagram of components for elimination of pop-up noise in the class D amplifier of FIG. 3 or 4, according to an embodiment of the present invention.

Thus, the reset circuit 240 in FIG. 3 includes a reset signal source 241 and a switch 243 that is a PMOSFET (P-channel metal oxide field effect transistor) in one embodiment of the present invention. FIG. 8 shows a power voltage source 302 generating the power supply voltage to be applied on components 220 and 230 of the class D amplifier 200. Referring to FIGS. 3 and 8, the reset signal source 241 also includes a comparator and timer unit 304.

Operation of the reset circuit 240 is now described in reference to the timing diagram of FIG. 5. FIG. 5 shows a timing diagram of the driver voltage which is the voltage formed when the power supply voltage is initially applied to the driver circuit 230. FIG. 5 also shows a timing diagram of the digital circuit voltage which is the voltage formed when the power supply voltage is initially applied to the delay controller 220. FIG. 5 further shows a timing diagram of the output of the reset signal source 241 relative to the driver voltage and the digital circuit voltage.

When the power supply voltage is initially applied to the class D amplifier 200, the driver voltage in FIG. 5 ramps to the stable high level. The comparator 304 of the reset signal source 241 determines a time point when the driver voltage is activated to reach a predetermined threshold voltage. For example, the predetermined threshold voltage may be the constant VDD eventually reached for the driver voltage.

The reset signal source 241 outputs a signal with a logic low state for a predetermined time period T1 from that time point by using the timer 304. After the predetermined time period T1, the reset signal source 241 outputs a signal with a logic high state. The switch 243 is turned on when the reset signal source 241 outputs the logic low signal, and is turned off when the reset signal source 241 outputs the logic high signal.

Referring to FIGS. 3 and 5, the switch 243 is initially turned on for the time period T1 for coupling a predetermined voltage such as the power supply voltage VDD to the input of the P-channel buffer 231. Such a predetermined voltage is amplified to the PMOS transistor MP5 that is turned off for the time period T1.

Pop-up noise is not generated with the PMOS transistor MP5 turned off during the time period T1 when the operation of the delay controller 220 is unpredictable. FIG. 7 illustrates pop-up noise that may be generated during such a time period T1 in a conventional D class amplifier without the reset circuit 240. In addition, FIG. 7 illustrates elimination of such pop-up noise with the D class amplifier 200 having the reset circuit 240.

The time period T1 is empirically determined to be sufficient for the digital circuit voltage to be stabilized for proper operation of the delay controller 220. Thus, after the time period T1, the delay controller 220 operates properly to predictably generate the P-channel and N-channel PWM signals. Accordingly, the PMOSFET 243 of the reset circuit 240 is turned off after time period T1 by the logic high signal from the reset signal source 241 such that the P-channel and N-channel PWM signals from the delay controller 220 are coupled to the driver circuit 230.

FIG. 6 shows a timing diagram of the driver voltage, the digital circuit voltage, and the output of the reset signal source 241 when the power supply voltage is deactivated. In FIG. 6, the driver voltage is deactivated after the digital circuit voltage applied on the delay controller 220 is deactivated.

In that case, referring to FIGS. 3, 6, and 8, the power voltage source 302 sends a power voltage control signal to the timer 304 of the reset signal source 241 indicating that the power supply voltage will be deactivated at a future time from a current time point. The timer 304 is used within the reset signal source 241 that outputs a logic low signal to the gate of the PMOSFET 243 a predetermined time period T2 before the digital circuit voltage is likely to be deactivated. Such a time period T2 may be determined empirically.

Thus, the PMOSFET switch 243 is closed the predetermined time period T2 before the digital circuit voltage is deactivated. The closed PMOSFET 243 couples the high power voltage to the P-channel buffer 231 such that the PMOS transistor MP5 is turned off for the time period T2 before deactivation of the digital circuit voltage. Thus, the PMOS transistor MP5 is turned off for the time period T2 before the delay controller 220 outputs unpredictable P-channel and N-channel PWM signals for preventing pop-up noise during deactivation of the power supply voltage in FIG. 6.

The reset signal source 241 may be implemented either inside or outside of the class D amplifier 200. When the reset signal source 241 is implemented outside of the class D amplifier 200, a signal for controlling the switch 243 may be received through a transmission line from such an external signal source.

Figure 4:
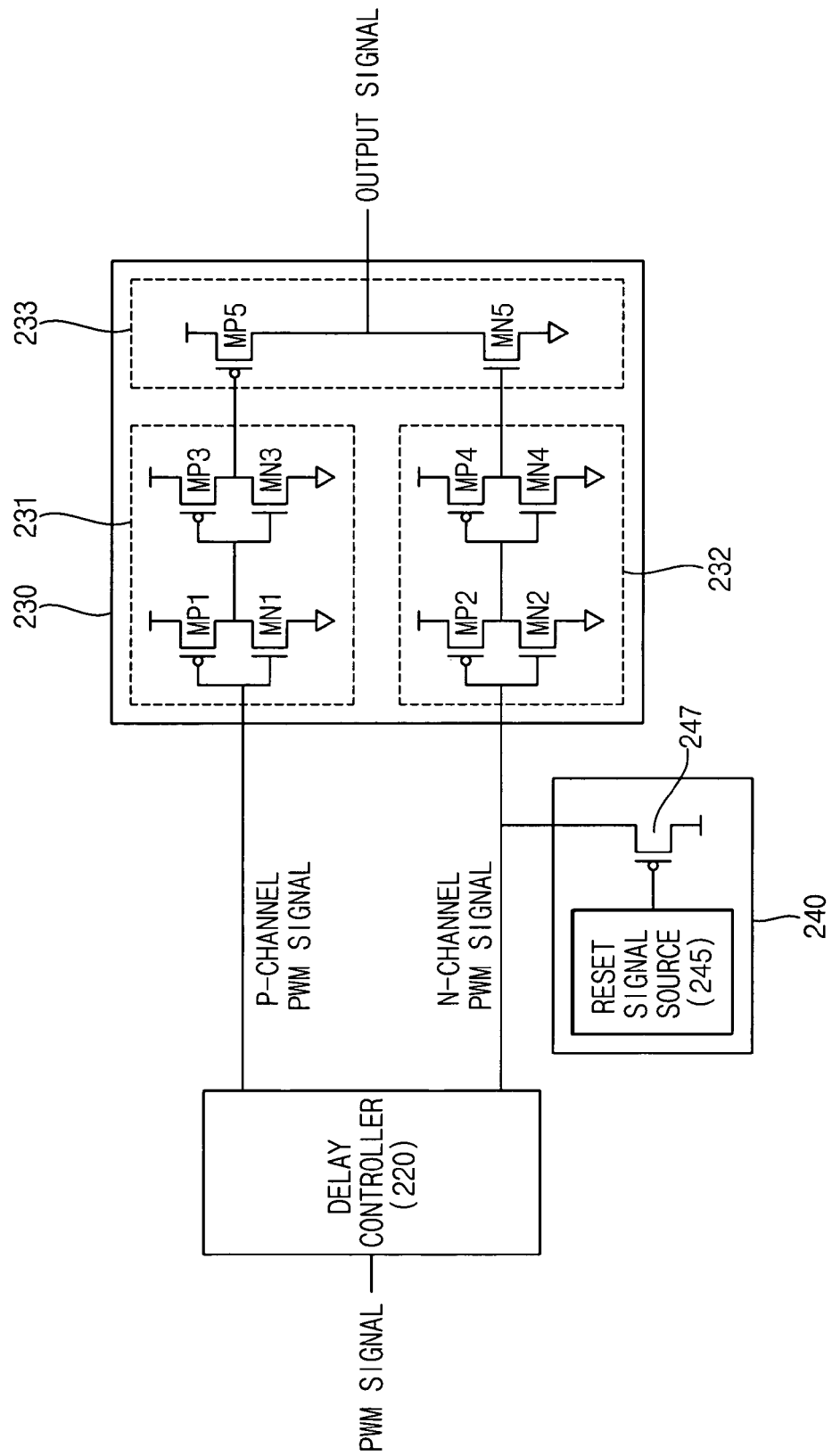
FIG. 4 is a circuit diagram of components within the class D amplifier in FIG. 2, according to another embodiment of the present invention.

FIG. 4 is a circuit diagram of the driver circuit 230 and the reset circuit 240 of FIG. 2, according to another embodiment of the present invention. Elements having the same reference number in FIGS. 3 and 4 refer to elements having similar structure and/or function. However, the reset circuit 240 in FIG. 4 is coupled to the input of the N-channel buffer 232, and the reset circuit 240 includes a PMOSFET 247 and a reset signal source 245.

Referring to FIGS. 4 and 5, the reset signal source 245 and the PMOSFET 247 of FIG. 4 operate similarly as described in reference to FIG. 3 to couple the predetermined high voltage to the N-channel buffer 232 for the predetermined time period T1 after the driver voltage reaches the predetermined threshold voltage. Referring to FIGS. 4 and 6, the reset signal source 245 and the PMOSFET 247 of FIG. 4 operate similarly as described in reference to FIG. 3 to couple the predetermined high voltage to the N-channel buffer 232 for the predetermined time period T2 before the digital circuit voltage is expected to be deactivated.

However, in FIG. 4, the high voltage coupled to the N-channel buffer 232 turns on the NMOS transistor MN5 such that the output signal is fixed to the ground voltage for such time periods T1 and T2 for preventing pop-up noise. The present invention may also be practiced with a respective reset circuit 240 simultaneously coupled to each of both of the P-channel buffer 231 and the N-channel buffer 232.

In this manner, pop-up noise is prevented during initial application of the power supply voltage and during deactivation of the power supply voltage with the reset circuit 240. In addition, the reset circuit 240 may be implemented as an integrated circuit on a silicon chip for maintaining a small size and low cost of the audio device having the class D amplifier 200.

The foregoing is by way of example only and is not intended to be limiting. For example, any numbers or number of elements described and illustrated herein is by way of example only. In addition, the present invention may be practiced with other types of switching devices aside from the example field effect transistors.

The present invention is limited only as defined in the following claims and equivalents thereof.

What is claimed is:

1. A class D amplifier comprising:
a driver circuit configured to amplify a PWM (pulse width modulation) signal to generate an amplified PWM signal; and
a reset circuit for applying a predetermined voltage at an input of the driver circuit for a time period after a power supply voltage for the class D amplifier is applied or before the power supply voltage is deactivated;
wherein the driver circuit includes:
a plurality of buffers for amplifying channel PWM signals to generate amplified channel PWM signals; and
a power output stage with power transistors having the amplified channel PWM signals applied thereon,
wherein the predetermined voltage of the reset circuit is applied at an input of one of the plurality of buffers that is coupled between the reset circuit and the power transistors.

2. The class D amplifier of claim 1, wherein the power output stage includes a P-channel power transistor and an N-channel power transistor that are complementarily turned on depending on a logic state of the PWM signal.

3. The class D amplifier of claim 2, wherein the predetermined voltage from the reset circuit turns off the P-channel power transistor for the time period.

4. The class D amplifier of claim 2, wherein the predetermined voltage from the reset circuit turns on the N-channel power transistor for the time period.

5. The class D amplifier of claim 2, wherein the driver circuit includes:
a P-channel buffer for amplifying a P-channel PWM signal to generate an amplified P-channel PWM signal that is applied on a gate of the P-channel power transistor; and
an N-channel buffer for amplifying an N-channel PWM signal to generate an amplified N-channel PWM signal that is applied on a gate of the N-channel power transistor.

6. The class D amplifier of claim 5, wherein the reset circuit includes:
a switch coupled between an input of one of the P-channel and N-channel buffers and a voltage source generating the predetermined voltage; and
a reset signal source that turns on the switch for the time period.

7. The class D amplifier of claim 6, wherein the switch is a field effect transistor.

8. A class D amplifier comprising:
a driver circuit configured to amplify a PWM (pulse width modulation) signal to generate an amplified PWM signal;
a reset circuit for applying a predetermined voltage at an input of the driver circuit for a time period after a power supply voltage for the class D amplifier is applied or before the power supply voltage is deactivated;
a power output stage having a P-channel power transistor and an N-channel power transistor that are complementarily turned on depending on a logic state of the PWM signal;

wherein the driver circuit includes:
a P-channel buffer for amplifying a P-channel PWM signal to generate an amplified P-channel PWM signal that is applied on a gate of the P-channel power transistor; and
an N-channel buffer for amplifying an N-channel PWM signal to generate an amplified N-channel PWM signal that is applied on a gate of the N-channel power transistor; and
a delay controller for generating the P-channel and N-channel PWM signals each with a respective transition such that the P-channel and N-channel power transistors are not turned on simultaneously.

9. The class D amplifier of claim 8, wherein the time period is after the power supply voltage to the driver circuit is applied or before the power supply voltage to the delay controller is deactivated.

10. The class D amplifier of claim 9, wherein the time period is determined from when the power supply voltage reaches a predetermined threshold voltage.

11. An audio device comprising:
a PWM (pulse width modulation) processor that converts audio data into a PWM signal;
a class D amplifier including:
a driver circuit configured to amplify the PWM signal to generate an amplified PWM signal; and
a reset circuit for applying a predetermined voltage at an input of the driver circuit for a time period after a power supply voltage is applied to the class D amplifier or before the power supply voltage is deactivated;
wherein the driver circuit includes:
a plurality of buffers for amplifying channel PWM signals to generate amplified channel PWM signals; and
a power output stage with power transistors having the amplified channel PWM signals applied thereon,
wherein the predetermined voltage of the reset circuit is applied at an input of one of the plurality of buffers that is coupled between the reset circuit and the power transistors;
a low-pass filter for low-pass filtering the amplified PWM signal to provide an audio signal; and
a speaker for generating sound from the audio signal.

12. The audio device of claim 11, wherein
the power output stage includes a P-channel power transistor and an N-channel power transistor that are complementarily turned on depending on a logic state of the PWM signal.

13. The audio device of claim 12, wherein the predetermined voltage from the reset circuit turns off the P-channel power transistor for the time period.

14. The audio device of claim 12, wherein the predetermined voltage from the reset circuit turns on the N-channel power transistor for the time period.

15. The audio device of claim 12, wherein the driver circuit includes:
a P-channel buffer for amplifying a P-channel PWM signal to generate an amplified P-channel PWM signal that is applied on a gate of the P-channel power transistor; and
an N-channel buffer for amplifying an N-channel PWM signal to generate an amplified N-channel PWM signal that is applied on a gate of the N-channel power transistor.

16. The audio device of claim 15, wherein the reset circuit includes:
a switch coupled between an input of one of the N-channel and P-channel buffers and a voltage source generating the predetermined voltage; and
a reset signal source that turns on the switch for the time period.

17. The audio device of claim 16, wherein the switch is a field effect transistor.

18. The audio device of claim 15, wherein the class D amplifier further includes:
a delay controller for generating the P-channel and N-channel PWM signals each with a respective transition such that the P-channel and N-channel power transistors are not turned on simultaneously.

19. The audio device of claim 18, wherein the time period is after the power supply voltage to the driver circuit is applied or before the power supply voltage to the delay controller is deactivated.

20. The audio device of claim 19, wherein the time period is determined from when the power supply voltage reaches a predetermined threshold voltage.

* * * * *